(12) United States Patent
Zhang

(10) Patent No.: US 11,131,792 B2
(45) Date of Patent: Sep. 28, 2021

(54) OPTICAL FILM

(71) Applicant: SHINE OPTOELECTRONICS (KUNSHAN) CO., LTD, Kunshan (CN)

(72) Inventor: Jian Zhang, Kunshan (CN)

(73) Assignee: SHINE OPTOELECTRONICS (KUNSHAN) CO., LTD, Kunshan (CN)

( * ) Notice: Subject to any disclaimer, the term of this patent is extended or adjusted under 35 U.S.C. 154(b) by 0 days.

(21) Appl. No.: 15/865,239

(22) Filed: Jan. 8, 2018

(65) Prior Publication Data

US 2018/0299584 A1 Oct. 18, 2018

Related U.S. Application Data

(63) Continuation of application No. PCT/CN2016/089111, filed on Jul. 7, 2016.

(30) Foreign Application Priority Data

Jul. 8, 2015 (CN) .......................... 201510397170.2
Jul. 8, 2015 (CN) .......................... 201510397220.7
(Continued)

(51) Int. Cl.
*G02B 27/10* (2006.01)
*G02B 1/04* (2006.01)
(Continued)

(52) U.S. Cl.
CPC ........... *G02B 1/041* (2013.01); *B42D 25/324* (2014.10); *B42D 25/351* (2014.10); *G02B 1/10* (2013.01);
(Continued)

(58) Field of Classification Search
CPC ............ B29D 11/00278; G02B 3/0006; G02B 3/0031; G02B 27/2214
(Continued)

(56) References Cited

U.S. PATENT DOCUMENTS

| 3,636,147 A | 1/1972 | Rowland |
| 6,329,040 B1 * | 12/2001 | Oshima ..................... B44F 3/00 428/156 |

(Continued)

FOREIGN PATENT DOCUMENTS

| CN | 1579732 A | 2/2005 |
| CN | 1595310 A | 3/2005 |

(Continued)

OTHER PUBLICATIONS

International Search Report for Int'l Application No. PCT/CN2016/089111, titled: Optical Film, dated Sep. 29, 2016.
(Continued)

*Primary Examiner* — Mahidere S Sahle
(74) *Attorney, Agent, or Firm* — Flener IP & Business Law; Zareefa B. Flener

(57) ABSTRACT

The present application discloses an optical film of a double-sided structure. The optical film of a double-sided structure comprises: a body which includes a polymer, having a first surface and a second surface opposite to each other; and an accommodation mechanism, provided on the first surface and the second surface, and used for forming a graphic structure on a surface of the body. The body comprising the accommodation mechanism is an integral structure. The accommodation mechanism comprises a groove, and the accommodation mechanism accommodates a filler to form the graphic structure. The filler comprises one or more of an electrically conductive material, a coloring material, or a dyeing material. The polymer comprises thermosetting resin
(Continued)

and/or photocurable resin. The body has a transmittance of above 0.7. The optical film provided by the present application has a thickness which is beneficial to reduce an optical film.

8 Claims, 8 Drawing Sheets

(30) Foreign Application Priority Data

| | | | |
|---|---|---|---|
| Jul. 8, 2015 | (CN) | ......................... | 201520488395.4 |
| Jul. 8, 2015 | (CN) | ......................... | 201520488918.5 |
| Jul. 8, 2015 | (CN) | ......................... | 201520488919.X |
| Jul. 8, 2015 | (CN) | ......................... | 201520488920.2 |

(51) Int. Cl.
| | |
|---|---|
| *G02B 3/00* | (2006.01) |
| *B42D 25/324* | (2014.01) |
| *B42D 25/351* | (2014.01) |
| *G02B 1/10* | (2015.01) |
| *H05K 1/02* | (2006.01) |
| *H05K 1/03* | (2006.01) |
| *H05K 3/12* | (2006.01) |
| *B42D 25/36* | (2014.01) |

(52) U.S. Cl.
CPC ........... *G02B 3/005* (2013.01); *G02B 3/0031* (2013.01); *H05K 1/0274* (2013.01); *H05K 1/0353* (2013.01); *B42D 25/36* (2014.10); *H05K 3/1258* (2013.01)

(58) Field of Classification Search
USPC .......................................... 359/455, 619–624
See application file for complete search history.

(56) References Cited

U.S. PATENT DOCUMENTS

| | | | | |
|---|---|---|---|---|
| 6,404,555 | B1 | 6/2002 | Nishikawa | |
| 7,468,842 | B2 * | 12/2008 | Steenblik | ............... B42D 25/43 359/619 |
| 2007/0121207 | A1 | 5/2007 | Miyaki et al. | |
| 2007/0273143 | A1 | 11/2007 | Crane et al. | |
| 2015/0289370 | A1 * | 10/2015 | Gao | ............... H01L 31/022466 174/255 |
| 2017/0246900 | A1 | 8/2017 | Cote | |

FOREIGN PATENT DOCUMENTS

| | | |
|---|---|---|
| CN | 1906547 A | 1/2007 |
| CN | 101169496 A | 4/2008 |
| CN | 101443692 A | 5/2009 |
| CN | 101767511 A | 7/2010 |
| CN | 101850680 A | 10/2010 |
| CN | 102405434 A | 4/2012 |
| CN | 102455447 A | 5/2012 |
| CN | 102514443 A | 6/2012 |
| CN | 102540318 A | 7/2012 |
| CN | 102708946 A | 10/2012 |
| CN | 102991860 A | 3/2013 |
| CN | 103874585 A | 6/2013 |
| CN | 103207702 A | 7/2013 |
| CN | 103309047 A | 9/2013 |
| CN | 103874585 A | 6/2014 |
| CN | 104024921 A | 9/2014 |
| CN | 104118236 A | 10/2014 |
| CN | 104155707 A | 11/2014 |
| CN | 104203528 A | 12/2014 |
| CN | 205272920 U | 6/2016 |
| CN | 205374781 U | 7/2016 |
| CN | 205507122 U | 8/2016 |
| CN | 205507123 U | 8/2016 |
| CN | 106324716 A | 1/2017 |
| CN | 106324725 A | 1/2017 |
| CN | 205912318 U | 1/2017 |
| DE | 102011115125 A1 | 4/2013 |
| JP | 2000-81501 A | 3/2000 |
| WO | WO-2013053435 A1 * | 4/2013 |

OTHER PUBLICATIONS

Written Opinion for Int'l Application No. PCT/CN2016/089111, titled: Optical Film, dated Sep. 29, 2016.
International Preliminary Report on Patentability for Int'l Application No. PCT/CN2016/089111, titled: Optical Film, dated Jan. 9, 2018.
Non-Final Office Action dated Nov. 26, 2019 in U.S. Appl. No. 15/865,241 (9 pages).
Final Office Action dated Jun. 9, 2020 in U.S. Appl. No. 15/865,241, "Optical Film" (25 pages).
Non-Final Office Action dated Sep. 30, 2020 in U.S. Appl. No. 15/865,241, "Optical Film," (12 pages).

* cited by examiner

OPTICAL FILM

CROSS-REFERENCE TO RELATED REFERENCES

This application is a continuation of International Application No. PCT/CN2016/089111, which designated the United States and was filed on Jul. 7, 2016, published in Chinese, which claims a priority of the Chinese patent applications with the application No. 2015103971702, application No. 2015103972207, application No. 2015204883954, application No. 2015204889185, application No. 201520488919X and application No. 2015204889202 as submitted on Jul. 8, 2015, and the entire teachings of the above applications are incorporated herein by reference.

TECHNICAL FIELD

The present application relates to a technical field of optical films, especially relates to an optical film.

BACKGROUND ART

An optical film is a modern product combining the imprint technique, the micro-nano processing technique and the imaging technique, and has broad market prospects in the fields such as touch screens, anti-counterfeit labels and packaging, etc. In the touch screen field, an optical film can be used for manufacturing a transparent conductive film, such as the invention patent <a double-sided graphical transparent conductive film and a preparation method thereof> with the application No. 201210141850.4. In said patent, a groove network on upper and lower surfaces of an intermediate layer is made by using the imprint technique, a transparent conductive film made by using such preparation method has a three-layer structure, the intermediate layer is a substrate, upper and lower surfaces of the substrate are coated with a curable resin for imprinting a groove structure.

In the fields such as anti-counterfeit labels and packaging, an optical film, under a special structure, can produce a dynamic stereoscopic effect, for example the invention patent <a micro-optic security and image presentation system> with the application No. 200480040733.2, the invention patent <a safety film with a dynamic three-dimensional effect> with the application No. 201010180251.4, the invention patent <a packaging film with an anti-fake function with a three-dimensional dynamic displaying effect> with the application No. 201110266470.9 and the invention patent <a film of visual stereoscopic floating images and a manufacturing method thereof> with the application No. 201310229569.0 relate to an optical film structure which can produce a dynamic stereoscopic effect. Such optical film also has a three-layer structure, the intermediate layer is a substrate (referred to as a multilayer substrate layer or a film body in the above patents), upper and lower surfaces of the substrate are coated with a curable resin for imprinting a microlens array and a micrographic structure.

No matter in the touch screen field or in the fields such as anti-counterfeit labels and packaging, an optical film adopts a three-layer structure, wherein a substrate serves a function of providing a support platform to a curable resin at an imprint stage. In order to separate an imprint mold from a curable resin, thus an adhesive force between the substrate and the curable resin needs to be greater than an adhesive force between the curable resin and the imprint mold, which causes the substrate incapable of being separated from the curable resin, this is a root reason that at the present stage, an optical film stays at a three-layer structure.

Although an optical film has had revolutionary impacts on our life, since a substrate is retained in each optical film, the substrate increases the thickness of the optical film, thereby the transmittance of the optical film is reduced.

SUMMARY OF THE INVENTION

In view of deficiencies of the prior art, the present application provides an optical film, so as to advantageously reduce a thickness of a film.

In order to reach the above aim, the present application provides an optical film of a double-sided structure, comprising:

a body which includes a polymer, having a first surface and a second surface opposite to each other;

an accommodation mechanism, provided on the first surface and the second surface, and used for forming a graphic structure on a surface of the body;

the body comprising the accommodation mechanism being an integral structure.

In order to reach the above aim, the present application also provides an optical film of a double-sided structure, comprising:

a body which includes a first polymer and a second polymer, having a first surface and a second surface opposite to each other;

an accommodation mechanism, provided on the first surface and the second surface, and used for forming a graphic structure on a surface of the body;

adjacent parts between the first polymer and the second polymer fuse each other such that the body comprising the accommodation mechanism is an integral structure.

In order to reach the above aim, the present application also provides a manufacturing method of an optical film of a double-sided structure, comprising:

acquiring a primary body with a material being a polymer and presenting a colloidal state at a normal temperature and pressure;

forming a primary accommodation mechanism by using an imprinting device to imprint on the primary body's two surfaces opposite to each other;

curing the primary body to obtain the optical film of a double-sided structure which is an integral structure and has an accommodation mechanism.

In order to reach the above aim, the present application also provides a polymer film for imaging, comprising: a polymer having a first surface and a second surface opposite to each other;

the first surface being formed with a microlens structure;

the second surface being formed with an accommodation structure used for forming a graphic structure which images via the microlens structure;

the microlens structure and the accommodation structure being an integral structure.

In order to reach the above aim, the present application also provides a polymer film for imaging, comprising: a first polymer having a first surface and a second polymer having a second surface, the first surface and the second surface being opposite to each other;

the first surface being formed with a microlens structure;

the second surface being formed with an accommodation structure used for forming a graphic structure which images via the microlens structure;

an adjacent part between the first polymer and the second polymer is formed with a fusion portion, such that the microlens structure and the accommodation structure form an integral structure.

In order to reach the above aim, the present application also provides a polymer film for imaging, comprising: a polymer having a first surface and a second surface opposite to each other;

the first surface being formed with a microlens structure;

the second surface being formed with an accommodation structure used for forming a graphic structure which images via the microlens structure;

the microlens structure and the accommodation structure being an integral structure;

a surface of the microlens structure being provided with a reflection structure.

In order to reach the above aim, the present application also provides a polymer film for imaging, comprising: a first polymer having a first surface and a second polymer having a second surface, the first surface and the second surface being opposite to each other;

the first surface being formed with a microlens structure;

the second surface being formed with an accommodation structure used for forming a graphic structure which images via the microlens structure;

an adjacent part between the first polymer and the second polymer is formed with a fusion portion, such that the microlens structure and the accommodation structure form an integral structure;

a surface of the microlens structure being provided with a reflection structure.

In order to reach the above aim, the present application also provides a preparation method of a polymer film for imaging, including:

acquiring a polymer which presents a colloidal state at a normal temperature and pressure;

using a first mold having a microlens style to extrude a first side of the polymer, and using a second mold have a predetermined accommodation structure to extrude a second side of the polymer, to form a microlens preliminary structure and an accommodation preliminary structure which are in an integral structure; wherein the first side and the second side are opposite to each other;

curing the microlens preliminary structure and the accommodation preliminary structure, to respectively form a microlens structure and an accommodation structure, the accommodation structure being used for forming a graphic structure which images via the microlens structure so as to obtain the polymer film.

To sum up, it can be seen that in the technical solution provided by the present application, since a body of an optical film is an integral structure, there is no substrate in the body, meanwhile a manufacturing process does not need a substrate, thus an optical film of a double-sided structure provided in this embodiment is beneficial to reduce a thickness of an optical film.

DETAILED DESCRIPTION OF THE EMBODIMENTS

In order that the persons skilled in the art can better understand the technical solutions in the present application, the following is a clear and complete description on the technical solutions in the embodiments of the present application by combining with the figures in the embodiments of the present application, obviously the described embodiments are only a part of embodiments of the present application, not all the embodiments. Based on the embodiments in the present application, all the other embodiments obtained by ordinary persons skilled in the art without paying creative labor should belong to the protection scope of the present invention.

It needs to be stated that when an element is referred to as "being provided in" another element, it can be directly on another element or intervening elements may also be present. When an element is referred to as "being connected to" another element, it can be directly connected to another element or intervening elements may be present simultaneously. The terms "vertical", "horizontal", "left", "right" and similar expressions used herein are only for the purpose of illustration, and do not represent an only embodiment.

Unless otherwise defined, all the technical and scientific terms used herein have the same meaning normally understood by the persons skilled in the art of the present invention. The terms used in the Description of the present invention are only for the purpose of describing specific embodiments, not for limiting the present invention. The term "and/or" used herein includes one or more relevant arbitrary or all the combinations of a listed item.

Figure 1:
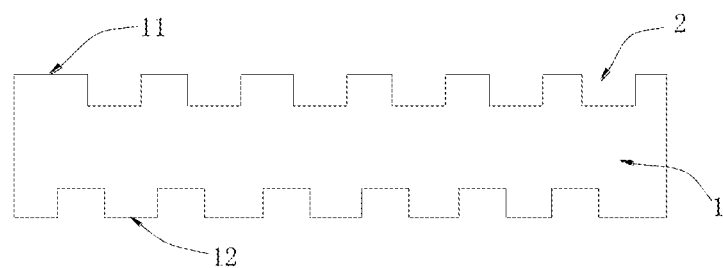
FIG. 1 is a schematic diagram of an optical film of a double-sided structure, as provided by an embodiment of the present application.

Referring to FIG. 1, it is an optical film of a double-sided structure as provided by an embodiment of the present application, comprising: a body 1 which includes a polymer, having a first surface 11 and a second surface 12 opposite to each other; and an accommodation mechanism 2, provided on the first surface 11 and the second surface 12, and used for forming a graphic structure on a surface of the body 1; the body 1 comprising the accommodation mechanism 2 is an integral structure.

Figure 2:
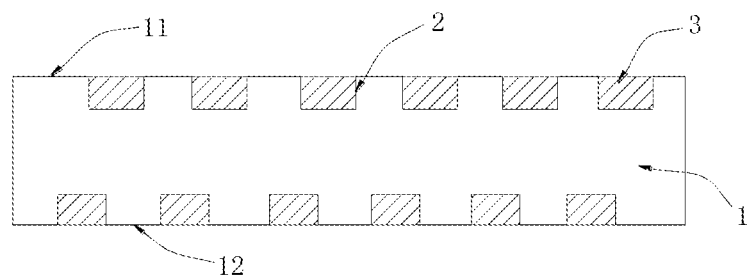
FIG. 2 is a schematic diagram of an optical film of a double-sided structure filled with a filler, as provided by an embodiment of the present application.

When using the above optical film of a double-sided structure, a material (an object) such as an electrically conductive material, a color material or other material can be filled in the accommodation mechanism 2 based on a demand, as shown in FIG. 2, thereby to obtain a required an electrically conductive film or a anti-counterfeit label, etc. Of course, when manufacturing the optical film of a double-sided structure, in order to make the body 1 be formed as an integral structure and have the accommodation mechanism 2, imprint and curing can be performed simultaneously during the manufacturing process, such that once the curing is completed, a colloidal polymer can be directly formed as the integrally structured body 1 having the accommodation mechanism 2.

It can be seen that in the technical solution provided by the present embodiment, since the body 1 of the optical film of a double-sided structure is an integral structure, there is no substrate in the body 1, meanwhile a manufacturing process does not need a substrate, thus the optical film of a double-sided structure provided by this embodiment is beneficial to reduce a thickness of an optical film.

Meanwhile, since the optical film of a double-sided structure provided by this embodiment has no substrate limitation of the prior art, a thickness of the optical film of a double-sided structure provided by this embodiment, relative to a thickness of an optical film of the prior art, can decrease to a greater extent, even reaching several micrometers.

Meanwhile, since there is no substrate of the prior art in the optical film of a double-sided structure provided by this embodiment, compared with an optical film having a three-layer structure in the prior art, the weight of the optical film can be reduced significantly.

Meanwhile, since there is no substrate of the prior art in the optical film of a double-sided structure provided by this embodiment, compared with an optical film having a three-layer structure in the prior art, the transmittance of the optical film can be improved significantly.

Figure 5:
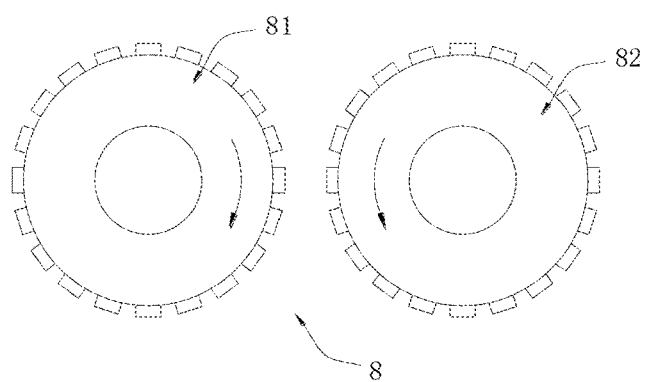
FIG. 5 is a schematic diagram of an imprinting device in the imprint steps of the manufacturing method as shown in FIG. 4.

In this embodiment, a thickness of an optical film of a double-sided structure can be 2 to 150 micrometers. When imprinting the body 1, the thickness of the body 1 can be controlled by controlling the amount of a raw material and the extrusion force of the imprinting device 8 as shown in FIG. 5, the greater the extrusion force is, the smaller the thickness of the body 1 is, thereby the thinner a manufactured optical film of a double-sided structure is. Currently, electronic products such as mobile phones and computers, etc. are used to apply the "ultrathin" concept, the thickness of these electronic products also tend to be thinner, while the optical film of a double-sided structure provided by this embodiment can be used in the screens of these electronic products, and the extrusion force of the imprinting device 8 is controlled based on different demands, such that the thickness of the optical film of a double-sided structure is less than 50 micrometers. On the other hand, considering that the optical film of a double-sided structure provided by this embodiment can be also pasted on a surface of an item for decoration, in order that there is no obvious steps feeling when touching a pasted surface of an item after the optical film is pasted, by controlling the amount of a polymer and the extrusion force of the imprinting device 8, the thickness of the optical film of a double-sided structure can be less than 40 micrometers or 30 micrometers.

(1) The body 1 may include a polymer's structure having any shape. In order to facilitate practical applications, the body 1 as a whole can be in a shape of a thin layer. Of course, the shape of a thin layer can be tabular, wavy, or irregular shaped, etc., preferably, the body 1 can be solid-state tabular. Specifically, the body 1 can be an one-layer solid-state polymer layer, the one-layer polymer layer is a polymer. Accordingly, a raw material for manufacturing the body 1 can be a primary body having an one-layer polymer layer (in a colloidal state), the colloidal polymer layer can be formed integrally after imprinting and curing, to form the body 1 having an integral structure. Polymers in the body 1 can distribute evenly, or can distribute unevenly. When polymers distribute unevenly, many regions having different densities will be formed in the body 1, while there is no interface between adjacent regions, namely there is no interface in the whole body 1, so as to ensure the transmittance of the body 1.

(2) It needs to be stated that the polymer can include a class of polymers and a polymer, or the polymer can also include a mixed polymer formed by multiclass of polymers or a plurality of polymers, this embodiment is not limited to that. Of course, the body 1 is a colloidal primary body before being formed integrally, the primary body will transform from a colloidal state to a solid state under heating or irradiation by a heat source or an irradiation source. Considering that a photocurable resin and a thermosetting resin have good fidelity when forming a graphic structure, it is not easy for a pattern to affect a profile of a graphic structure due to a tension of the photocurable resin and the thermosetting resin. Preferably, the polymer can include a thermosetting resin and/or a photocurable resin. Namely, the polymer can be a thermosetting resin, a photocurable resin or a mixture of the thermosetting resin and the photocurable resin. For example, the polymer can be an UV gel (a photosensitive gel), considering that an UV gel in practice has multiple types and kinds, the polymer can be also a mixture of multiple UV gels.

(3) In order to ensure a display effect of a graphic structure of a whole optical film of a double-sided structure and to prevent display of the graphic structure from being affected by the color of the body 1 itself, the transmittance of the body 1 can be greater than 0.7. The transmittance of the body 1 being greater than 0.7 can be a transmittance for natural light being greater than 0.7. Of course, in order to obtain the body 1 having different colors, the body 1 itself can have a color, for example, the reflectivity of the body 1 with respect to yellow light can be controlled higher than 0.9, but the transmittance with respect to other color light is still greater than 0.7. Where the body 1 is transparent but have a color, a color of a graphic structure can be displayed clearly if being different from the color of the body 1. Of course, in this embodiment, the transmittance of the body 1 with respect to natural light being greater than 0.7 is a better embodiment.

(4) The first surface 11 and the second surface 12 are opposite to each other, the area of the first surface 11 and of the second surface 12 can be much larger than the area of other side surfaces of the body 1. Of course, the area of the first surface 11 and of the second surface 12 can be same, or can be different. Preferably, in this embodiment, the area of the first surface 11 and of the second surface 12 being same is a preferred embodiment. The first surface 11 and of the second surface 12 can be a plane structure. Accordingly, other surfaces of the first surface 11 and the second surface 12 minus a surface of the area occupied by the accommodation mechanism 2 can be planes.

(5) The accommodation mechanism 2 is provided at the first surface 11 and the second surface 12 of the body 1. Of course, a shape and/or track of the accommodation mechanism 2 located at the first surface 11 and a shape and/or track of the accommodation mechanism 2 located at the second surface 12 can be same, or can be different. The accommodation mechanism 2 is formed by imprinting on a surface of a colloidal polymer, and its shape is unchangeable after curing. Therefore, a shape of the accommodation mechanism 2 correlates with an imprint mold. Thus, different styles of molds can be manufactured based on needs, thereby an accommodation mechanism 2 having a required style can be obtained.

(6) The accommodation mechanism 2 can be a trench, a groove, a recess or a hole. In this embodiment, the accommodation mechanism 2 being a groove is a preferred solution. A groove can be in a regular or irregular shape, or can be latticed or curved, the present application is not limited to these. When an optical film of a double-sided structure of this embodiment is used for manufacturing a conductive film, a groove being latticed can be a preferred solution. Thereby, a groove has mutually vertical meridian lines and latitude lines to divide the first surface 11 and the second surface 12 into a plurality of square regions. When an optical film of a double-sided structure of this embodiment is used for manufacturing an anti-counterfeit label or packaging, a logo, a mark or a profile or character of a pattern can be displayed by means of a groove track. Of course, a shape of a cross-section of the accommodation mechanism 2 can be also multiple, can be semicircular, semielliptic or irregularly shaped, and a shape of a cross-section of the accommodation mechanism 2 on the same one surface can include one or more of an U shape, an arc shape and an irregular shape.

(7) The accommodation mechanism 2 is used for forming a graphic structure on a surface of the body 1, specifically, as shown in FIG. 2, the accommodation mechanism 2 can accommodate a filler 3 to form the graphic structure. A graphic structure can be a pattern, a text message or a track structure. Based on different accommodation mechanisms 2 on the first surface 11 and the second surface 12 and different fillers 3, a graphic structure displayed on the first surface 11 and the second surface 12 can be also different. On the same one surface, the filler 3 in the accommodation mechanism 2 can also include multiple kinds, thereby a displayed pattern can have different colors and styles.

(8) The filler 3 can comprise one or more of an electrically conductive material, a coloring material, or a dyeing material. An electrically conductive material can be silver, copper, ITO (indium tin oxid), graphene or an electrically conductive polymer, and an electrically conductive material is filled in the accommodation mechanism 2 such that the optical film of a double-sided structure is formed as electrically conductive film, thereby can be used on a touch screen of an electronic device such as a mobile phone screen and a computer screen, etc. For example, an electrically conductive material can be a nano silver ink, the nano silver ink is sintered after being filled in the accommodation mechanism 2, then filling of an electrically conductive material can be completed. There are multiple coloring materials and dyeing materials, such as a pigment, a coating. The filler 3 can be liquid or solid, for example an electrically conductive material can be a nano silver ink, a coloring material can be a nano colored powder. The filler 3 being filled in the accommodation mechanism 2 can make the accommodation mechanism 2 fail to be filled to the full, just be filled to the full or be higher than an upper edge of the accommodation mechanism 2. Taking FIG. 2 as an example, the filler 3 is in a state of just filling to the full in a groove, the upper end surface of the filler 3 is just flush with the upper edge of the groove.

Figure 3:
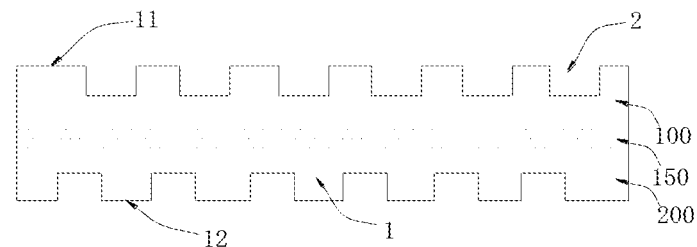
FIG. 3 is a schematic diagram of an optical film of a double-sided structure, as provided by an embodiment of the present application.

(9) Referring to FIG. 3, another embodiment of the present application further provides an optical film of a double-sided structure, comprising: a body 1 including a first polymer 100 and a second polymer 200, having a first surface 11 and a second surface 12 opposite to each other; and an accommodation mechanism 2, provided on the first surface 11 and the second surface 12, and used for forming a graphic structure on a surface of the body 1; adjacent parts 150 of the first polymer 100 and the second polymer 200 fuse with each other, such that the body 1 comprising the accommodation mechanism 2 is an integral structure.

(10) In this embodiment, the body 1 is a cured structure, thus the first polymer 100 and the second polymer 200 are solid. The body 1 can be formed by fusing adjacent parts 150 of two-layer solid polymer layers, the two-layer polymer layers are the first polymer 100 and the second polymer 200. Accordingly, a raw material for manufacturing the body 1 can be a primary body having a two-layer colloidal polymer layer, for example, the first polymer 100 can be formed by curing a first colloidal polymer in a colloidal state, accordingly, the second polymer 200 can be formed by curing a second colloidal polymer in a colloidal state. The first colloidal polymer and the second colloidal polymer can be a laminated structure before curing, and have a certain fusion property. Further, during extruding the first colloidal polymer and the second colloidal polymer, starting from a part where both of them contact each other, their polymers begin to fuse gradually from less to more, thereby expand to their adjacent parts 150. Meanwhile during lamination, curing can be performed simultaneously, finally causing the adjacent parts 150 of the first polymer 100 and the second polymer 200 to fuse each other, such that the body 1 having the accommodation mechanism 2 is an integral structure, thereby to ensure an optical film of a double-sided structure of this embodiment also does not need and use a substrate.

(11) The adjacent parts 150 of the first polymer 100 and the second polymer 200 fuse each other, such that a fusion location of the first polymer 100 and the second polymer 200 will not form an interface, to ensure the transmittance of the whole body 1 and improve the display quality of the optical film of a double-sided structure. As described above, in order to ensure fusion of the adjacent parts 150 of the first polymer 100 and the second polymer 200, it needs to ensure lamination and curing to be performed simultaneously during manufacturing, of course, a certain time interval can exist between them, but it at least needs to ensure there exists an overlap between the lamination time and the curing time. Further, in order to reduce an impact of the body 1 formed by the first polymer 100 and the second polymer 200 on a light path of a light ray and to ensure a display effect, a difference value of a refractive index of the first polymer 100 and the second polymer 200 is less than 0.5.

(12) The first polymer 100 and the second polymer 200 can include a class of polymers and a polymer, or the polymer can also include a mixed polymer formed by multiclass of polymers or a plurality of polymers, this embodiment is not limited to that. Of course, the body 1 is a colloidal primary body before being formed integrally, the primary body will transform from a colloidal state to a solid state under heating or irradiation by a heat source or an irradiation source. Therefore, preferably, the polymer can comprise a thermosetting resin and/or photocurable resin. Namely, the first polymer 100 and the second polymer 200 each can be a thermosetting resin, a photocurable resin or a mixture of the thermosetting resin and the photocurable resin. For example, the first polymer 100 and the second polymer 200 can be an UV gel (a photosensitive gel), considering that an UV gel in practice has multiple types and kinds, the first polymer 100 and the second polymer 200 each can be also a mixture of multiple UV gels.

Figure 4:
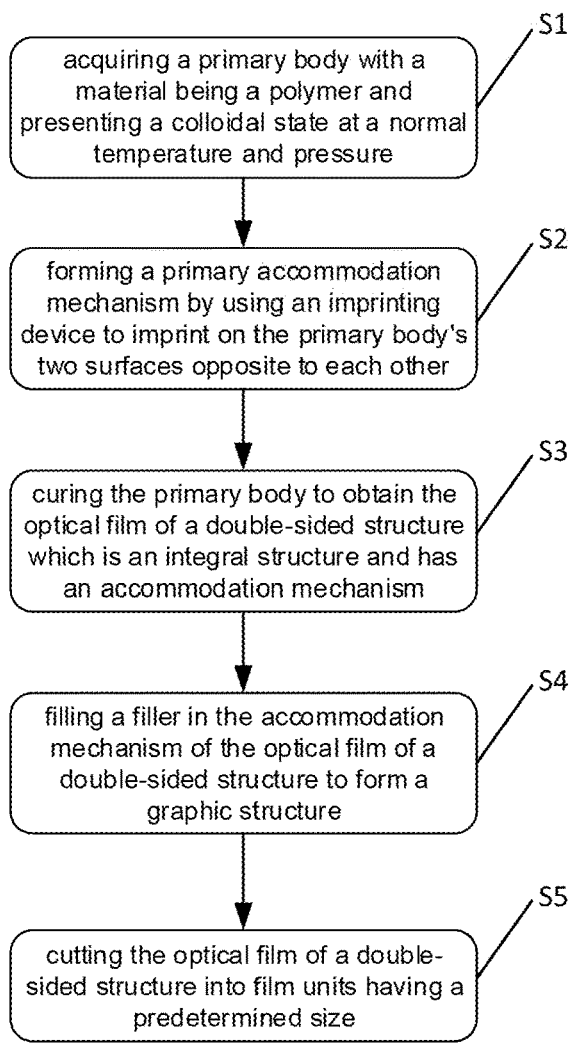
FIG. 4 is a flowchart of a manufacturing method of an optical film of a double-sided structure, as provided by the present application.

(13) Referring to FIG. 4, an embodiment of the present application further provides a manufacturing method of an optical film of a double-sided structure, including the following steps.

S1. acquiring a primary body with a material being a polymer and presenting a colloidal state at a normal temperature and pressure.

In this step, a primary body as a whole can be layered, can be a colloidal polymer layer, the colloidal state can mean having a certain liquidity and having a certain adhesion. The polymer includes a polymer or multiple polymers, the polymer at this moment presents a colloidal state at normal temperatures and pressures. After a polymer is cured, the polymer transforms from a colloidal state to a solid state. Of course, it still keeps a solid state at normal temperatures and pressures.

Polymers in the primary body do not need to distribute evenly, of course, it is best to distribute evenly. When polymers distribute unevenly, it is ok to have no interface inside the formed body 1, thereby to ensure the transmittance of the body 1 and not to affect a pattern display effect. The primary body can include an one-layer polymer (layer), can also include a two-layer polymer (layer), of course, can also include multiple layers based on demands, this embodiment is not limited to these.

S2. forming a primary accommodation mechanism by using an imprinting device to imprint on the primary body's two surfaces opposite to each other.

The primary body's two surfaces opposite to each other are the primary body's two sides having the largest area, the area of the two sides is much larger than the area of other sides of the primary body. The imprinting device 8 can extrude a primary body, meanwhile can imprint a surface of a primary body to form a primary accommodation mechanism. By extruding a primary body, a thickness of the primary body can be controlled, meanwhile where a primary body is a multilayer polymer, fusion between polymers at adjacent layers can be improved. The imprinting device 8 can be a protruding mold in which an end face has a protrusion with a certain shape track. When using, the imprinting device 8 is placed at two sides of a primary body, or a primary body is inputted in the imprinting device 8.

A shape track of the primary accommodation mechanism matches with the above protrusion with a certain shape track. The primary accommodation mechanism becomes the accommodation mechanism 2 after curing. In contrast, the primary accommodation mechanism is still in a colloidal state, and still has a possibility of deformation. The primary accommodation mechanism can be a trench, a groove, a recess or a hole. In this embodiment, the primary accommodation mechanism being a groove is a preferred solution. A groove can be in a regular or irregular shape, or can be latticed or curved, the present application is not limited to these. When an optical film of a double-sided structure manufactured in this embodiment is used for manufacturing a conductive film, a groove being latticed can be a preferred solution. Thereby, a groove has mutually vertical meridian lines and latitude lines to divide the first surface 11 and the second surface 12 into a plurality of square regions. When an optical film of a double-sided structure manufactured in this embodiment is used for manufacturing an anti-counterfeit label or packaging, a logo, a mark or a profile or character of a pattern can be displayed by means of a groove track. Of course, a shape of a cross-section of the accommodation mechanism 2 can be also multiple, can be semicircular, semielliptic or irregularly shaped, and a shape of a cross-section of a primary accommodation mechanism on the same one surface can include one or more of an U shape, an arc shape and an irregular shape.

(14) Specifically, the imprinting device 8 may comprise a laminating mold having a predetermined imprint structure or at least two rollers having a predetermined imprint structure; the predetermined imprint structure matches with the primary accommodation mechanism. A predetermined imprint structure is the above protrusion with a certain shape track. Laminating molds can be two separated plate-shaped molds, on a surface of which the predetermined imprint structure is provided. When using, a primary body is placed on a plate-shaped mold, then the other plate-shaped mold is placed on the primary body, an acting force is applied on the plate-shaped molds to extrude the primary body and to form a primary accommodation mechanism on the primary body's two surfaces opposite to each other.

(15) As shown in FIG. 5, at least two rollers having a predetermined imprint structure can be placed at two sides of a primary body during imprinting, and produce an extrusion force on the primary body. The at least rollers are driven by a drive mechanism and roll. Since a roller can continuously roll and laminate, compared with a mode of laminating through a plate-shaped mold, a mode for laminating by using a roller can accelerate to a greater extent the speed of manufacturing an optical film of a double-sided structure. A predetermined imprint structure can be placed on an outer peripheral face of a roller, can be formed directly by an outer peripheral face of a roller, for example a predetermined imprint structure is imprinted at an outer peripheral face of a roller, or a predetermined imprint structure can also be a cylindrical mold, and is located on an outer peripheral face of the cylindrical mold. Different cylindrical molds have different predetermined imprint structures, the cylindrical mold can be detachably sleeved on a roller. When needing accommodation mechanisms 2 having different styles, only corresponding cylindrical molds need to be replaced.

(16) It needs to be stated that primary accommodation mechanisms on a primary body's two surfaces opposite to each other can be formed simultaneously or can be formed not simultaneously. For example, when using the above two plate-shaped molds for imprinting, since a primary body is first placed on one plate-shaped mold, then the other plate-shaped mold is placed. It can be seen that primary accommodation mechanisms on two surfaces are not formed simultaneously. Moreover, when imprinting a primary body by adopting two rollers, since the primary body is located between two rollers, and at least two rollers roll simultaneously, it can be seen that primary accommodation mechanisms on two surfaces are formed simultaneously.

S3. curing the primary body to obtain the optical film of a double-sided structure which is an integral structure and has an accommodation mechanism.

In this step, whereas a primary body can adopt a colloidal thermosetting resin and/or photocurable resin, thus an irradiation source or a heat source can be adopted to irradiate or heat the primary body, such that the primary body is cured. For example, when a primary body is a colloidal UV gel, an irradiation source can be selected as an ultraviolet source.

(17) Curing a primary body and imprinting a primary body can be performed simultaneously, or can be performed at a certain time interval. However, it needs to be pointed out that an optical film of a double-sided structure can be obtained once curing is completed, at this moment, imprinting cannot continue. When there is a certain time interval between the step S3 and the step S2, partial time of the step S3 and the step S2 can coincide. No matter that curing a primary body and imprinting a primary body are performed simultaneously or performed at a certain time interval, a certain slight deformation of a primary accommodation mechanism caused due to a primary body not in a solid state can be prevented, thereby to have an effect on a display effect. Meanwhile, it can be also ensured that the primary body is formed integrally as an optical film of a double-sided structure having an integral structure.

(18) For example, two plate-shaped molds can be ultraviolet band transmissive light, namely the ultraviolet light can penetrate the plate-shaped molds to enter their insides. When imprinting by adopting two plate-shaped molds, a primary body can be imprinted first, at this moment, a primary accommodation mechanism has been generated on a surface of the primary body. Currently, the ultraviolet light can be adopted directly for irradiation, without removing the two plate-shaped molds, and the two plate-shaped molds are removed after the primary body is completely cured. It can be seen that in this case, although the step S3 is performed after the step S2 is performed, both of them end simultaneously.

(19) Therefore, it needs to be pointed out that there is no obvious start and end sequence for the step S3 and the step S2, the step S3 and the step S2 can start simultaneously and can end simultaneously, or the step S3 is performed earlier than the step S2 but ends later than the step S2, or the step S3 is performed later than the step S2 and ends later than the step S2, or in other sequences. Other ways or improvements made by persons skilled in the art without losing the essence revealed by the present application should fall into the protection scope of the present application.

Continuing to refer to FIG. 4, in a better embodiment, an optical film of a double-sided structure provided by the present application further includes the following steps.

S4. filling a filler in the accommodation mechanism of the optical film of a double-sided structure to form a graphic structure.

20) In the step S4, the filler 3 can comprise one or more of an electrically conductive material, a coloring material, or a dyeing material. An electrically conductive material can be silver, copper, ITO, graphene or an electrically conductive polymer, and an electrically conductive material is filled in the accommodation mechanism 2 such that the optical film of a double-sided structure is formed as electrically conductive film, thereby can be used on a touch screen of an electronic device such as a mobile phone screen and a computer screen, etc. For example, an electrically conductive material can be a nano silver ink, the nano silver ink is sintered after being filled in the accommodation mechanism 2, then filling of an electrically conductive material can be completed. There are multiple coloring materials and dyeing materials, such as a pigment, a coating. The filler 3 can be liquid or solid, for example an electrically conductive material can be a nano silver ink, a coloring material can be a nano colored powder. The filler 3 being filled in the accommodation mechanism 2 can make the accommodation mechanism 2 fail to be filled to the full, just be filled to the full or be higher than an upper edge of the accommodation mechanism 2.

(21) Whereas two surfaces of an optical film of a double-sided structure have same or different accommodation mechanisms 2, a filler 3 in an accommodation mechanism 2 on the same one surface can be one or more kind. Accordingly, for accommodation mechanisms 2 on two surfaces, the filler 3 can be also same or different, the present application is not limited to these.

Continuing to refer to FIG. 4, in another better embodiment, an optical film of a double-sided structure provided by the present application further includes the following steps:

S5. cutting the optical film of a double-sided structure into film units having a predetermined size.

(22) In this step, a cutting tool can be adopted to cut the optical film of a double-sided structure. For example, the optical film of a double-sided structure can be cut into a rectangular or square shape, a circular or an irregular shape. Of course, cutting can be also carried out based on a specific shape, style or scope of a pattern on the optical film of a double-sided structure. A predetermined size can be set based on a practical use of the optical film of a double-sided structure. For example, the optical film of a double-sided structure is used for a mobile phone screen, while currently most of mobile phone screens are 4 inches and 5.5 inches, the optical film of a double-sided structure can be cut into a corresponding size. Whereas the optical film of a double-sided structure is provided with an accommodation mechanism 2, when cutting, the integrity of the accommodation mechanism 2 needs to be ensured as much as possible. For example, when the accommodation mechanism 2 is a groove, the situation of dividing the groove into two segments needs to be avoided as much as possible.

(23) It needs to be stated that there is no obvious sequential order for performing the step S5 and the step S4, the step S5 can be performed earlier than the step S4, namely a filler 3 is filled after cutting the optical film of a double-sided structure; or the step S4 can be performed earlier than the step S5, namely first a filler 3 is filled for the optical film of a double-sided structure, then cutting is performed, the present application is not limited to these.

(24) Continuing to refer to FIG. 5, in a feasible embodiment, the imprinting device 8 can comprises a first roller 81 and a second roller 82 which are arranged in parallel and are spaced with a predetermined distance. The predetermined imprint structure comprises a first predetermined imprint structure and a second predetermined imprint structure. The first predetermined imprint structure is provided on an outer peripheral face of the first roller 81, and the second predetermined imprint structure is provided on an outer peripheral face of the first roller 82.

(25) The first predetermined imprint structure and the second predetermined imprint structure can be same, such that the first roller 81 and the second roller 82 form the same primary accommodation mechanism on two surfaces of a primary body. The first predetermined imprint structure and the second predetermined imprint structure can be different, such that the first roller 81 and the second roller 82 form different primary accommodation mechanisms on two surfaces of a primary body. The first predetermined imprint structure can locate directly on an outer peripheral face of the first roller 81 by means of engraving or forming integrally, or can be also a cylindrical mold sleeved on an outer peripheral face of the first roller 81. The second predetermined imprint structure can locate directly on an outer peripheral face of the second roller 82 by means of engraving or forming integrally, or can be also sleeved on an outer peripheral face of the second roller 82 for a cylindrical mold.

(26) The first roller 81 and the second roller 82 are arranged in parallel and are spaced with a predetermined distance, an adjustment of a thickness of an optical film of a double-sided structure can be realized by regulating a predetermined interval distance between the first roller 81 and the second roller 82. The first roller 81 and the second roller 82 can be horizontally arranged opposite to each other, or can be vertically arranged opposite to each other. Namely, the first roller 81 and the second roller 82 can be positioned on the same one horizontal plane, or can be positioned on the same one vertical plane. Of course, the present application does not define too much a positional relationship between the first roller 81 and the second roller 82, the first roller 81 and the second roller 82 only need to be arranged in parallel and be spaced with a predetermined distance. But in this embodiment, the first roller 81 and the second roller 82 being horizontally arranged opposite to each other or vertically arranged opposite to each other can be a preferred solution.

Figure 6:
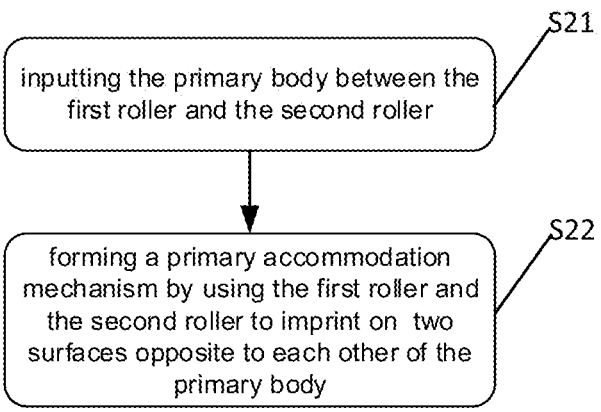
FIG. 6 is a flowchart of the imprint steps of the manufacturing method as shown in FIG. 4.

Accordingly, referring to FIG. 5 and FIG. 6, in this embodiment, the step S2 (the imprint step) includes the following steps.

S21. inputting the primary body between the first roller and the second roller;

22. forming a primary accommodation mechanism by using the first roller and the second roller to imprint on two surfaces opposite to each other of the primary body.

In the step S21, the primary body can be inputted between the first roller and the second roller at a predetermined speed, considering that when horizontally arranging the first roller 81 and the roller 82 opposite to each other, it is easy for a speed of the primary body entering into the imprinting device 8 to be affected by the gravity, thereby being difficult to be controlled, thus at this moment, the first roller 81 and the second roller 82 can be vertically arranged opposite to each other, and the primary body is inputted between the first roller and the second roller via an input pushing mechanism.

In the step S22, the first roller and the second roller's own rolling during imprinting can produce a certain friction on the primary body, to drive the primary body to move. Relying on the input pushing mechanism and the friction, the first roller and the second roller can continuously imprint the primary body, thereby to improve the production efficiency.

Figure 7:
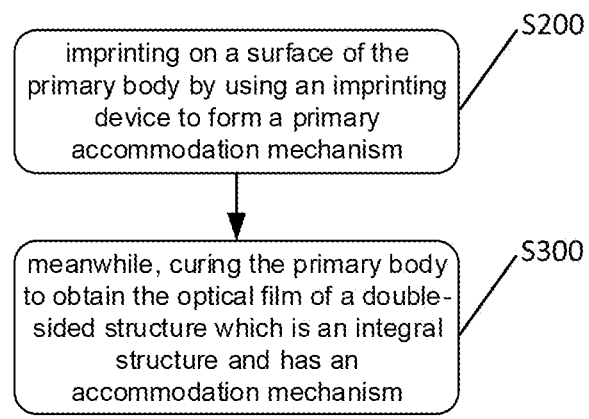
FIG. 7 is a flowchart of the imprint steps and curing steps of the manufacturing method as shown in FIG. 4.

Referring to FIG. 7, in a specific embodiment, the step S2 (the imprint step) and the step S3 (the curing step) can include the following steps.

S200. imprinting on a surface of the primary body by using an imprinting device to form a primary accommodation mechanism;

300. meanwhile, curing the primary body to obtain the optical film of a double-sided structure which is an integral structure and has an accommodation mechanism.

In this embodiment, the step S3 and the step S2 are performed simultaneously, namely the step S200 and the step S300 are performed simultaneously, such that a certain slight deformation of a primary accommodation mechanism caused due to a primary body not in a solid state can be prevented, thereby to have an effect on a display effect. Meanwhile, it can be also ensured that the primary body is formed integrally as an optical film of a double-sided structure having an integral structure.

(27) Taking the imprinting device 8 being the first roller 81 and the second roller 82 as an example, the first roller 81 and the second roller 82 can be also ultraviolet band transmissive light, namely the ultraviolet light can penetrate the plate-shaped molds to enter between the first roller 81 and the second roller 82, thereby to irradiate the primary body. The first roller 81 and the second roller 82 extrude a surface of the primary body and simultaneously imprint to form a primary accommodation mechanism, meanwhile cure the primary body, curing starts from the primary body entering into the first roller 81 and the second roller 82 and ends the primary body leaving the first roller 81 and the second roller 82. Of course, the moment of starting to cure the body 1 and the moment of starting to enter between the first roller 81 and the second roller 82 are not necessarily same, and are deemed to be performed simultaneously within a time interval having a controllable range.

For another example, that the primary body may comprise a first colloidal polymer and a second colloidal polymer is taken as an example.

Figure 8:
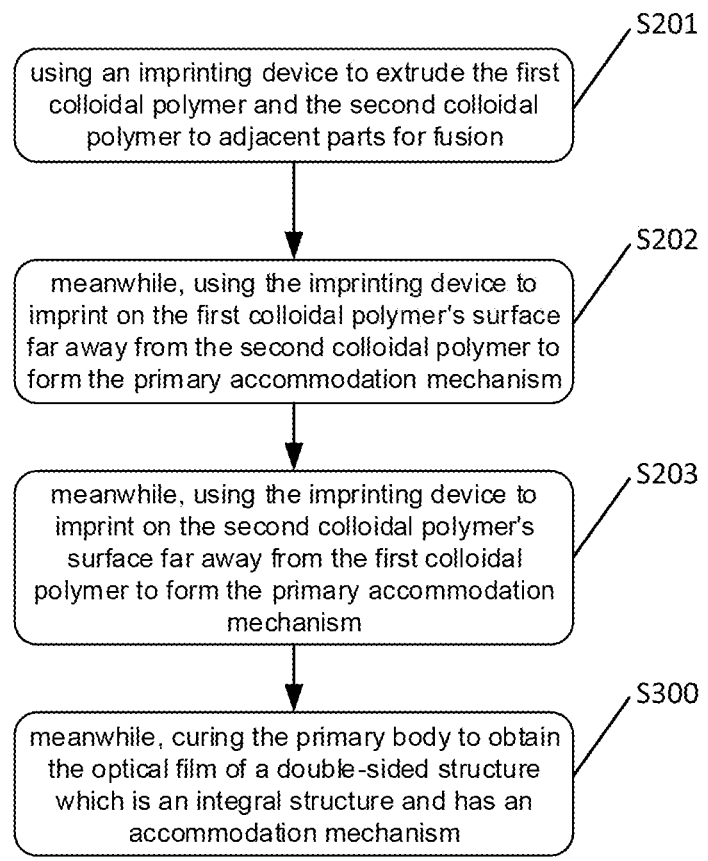
FIG. 8 is a flowchart of the imprint steps and curing steps of the manufacturing method as shown in FIG. 7.

Accordingly, as shown in FIG. 8, the step S2 (the imprint step) and the step S3 (the curing step) can include the following steps.

S201. using an imprinting device to extrude the first colloidal polymer and the second colloidal polymer to adjacent parts for fusion;

S202. meanwhile, using the imprinting device to imprint on the first colloidal polymer's surface far away from the second colloidal polymer to form the primary accommodation mechanism;

S203. meanwhile, using the imprinting device to imprint on the second colloidal polymer's surface far away from the first colloidal polymer to form the primary accommodation mechanism;

S300. meanwhile, curing the primary body to obtain the optical film of a double-sided structure which is an integral structure and has an accommodation mechanism.

Figure 9:
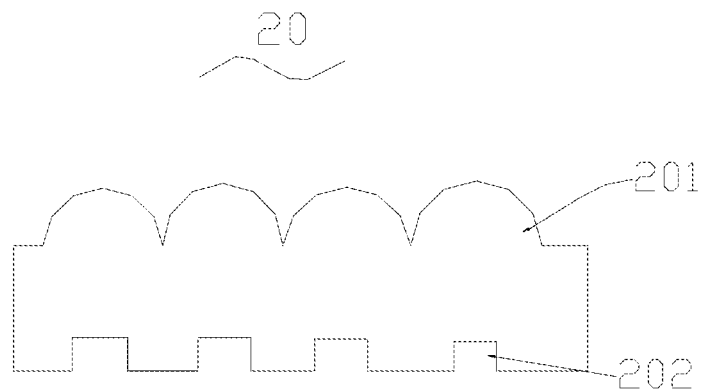
FIG. 9 is a structural schematic diagram of a polymer film which does not form a graphic structure, as provided by the embodiments of the present application.
Figure 10:
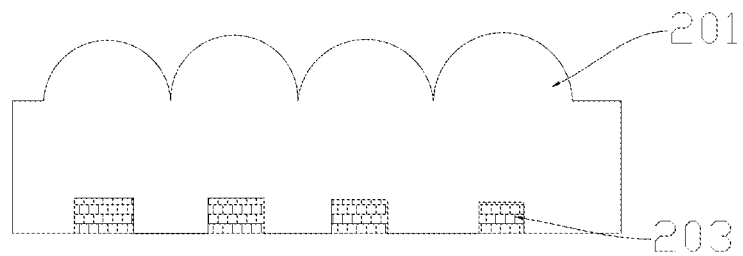
FIG. 10 is a structural schematic diagram of a polymer film which forms a graphic structure, as provided by the embodiments of the present application.

(28) As shown in FIG. 9, the embodiments of the present application provide a polymer film 20 which may comprise a polymer having a first surface and a second surface opposite to each other. A microlens structure 201 is formed on the first surface; an accommodation structure 202 is formed on the second surface, the accommodation structure 202 is used for forming a graphic structure 203 which images through the microlens structure 201, as shown in FIG. 10.

(29) The polymer can be a single polymer, or can be a mixed polymer formed by mixing a plurality of single polymers which will not react. The transmittance of the polymer can be greater than 70%, namely the polymer has a transparent color or is visually displayed transparent. The polymer may be a thermosetting resin and/or photocurable resin, such as an UV gel. The microlens structure 201 and the accommodation structure 202 can be respectively positioned on a first surface and a second surface opposite to each other in an one-layer polymer layer which is composed of such polymer, and at this moment, the polymers in the polymer layer can distribute evenly, or can distribute unevenly. Since the microlens structure 201 and the accommodation structure 202 are formed in the same polymer layer, there is no interface between the microlens structure 201 and the accommodation structure 202, namely the microlens structure 201 and the accommodation structure 202 are formed as an integral structure.

Figure 11:
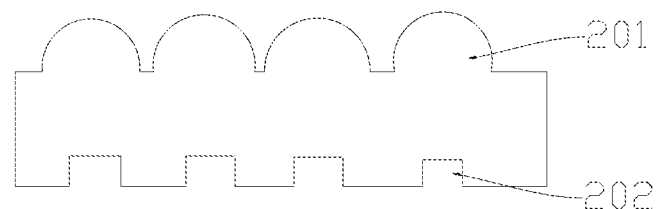
FIG. 11 is a structural schematic diagram of another polymer film, as provided by the embodiments of the present application.

(30) The microlens structure 201 may contain a microlens array which may contain one or more microlenses. There is no gap among the plurality of microlenses, so as to reduce the overall volume of the polymer film; there can be a gap among the plurality of microlenses (as shown in FIG. 11), such that the integrity of a cut microlens can be ensured when cutting the polymer film, thereby the subsequent imaging effect of the microlens can be ensured.

The accommodation structure 202 may contain one or more grooves, or may contain one or more micro grooves (i.e. grooves in a micron level). The (micro) grooves are used for being filled with a filler, so as to form a graphic structure 203.

(31) The graphic structure 203 contains a pattern formed after a filler is filled. The filler may be a material for which there is a refractive index difference between the polymer and the light, including a coloring material, a dyeing material, a metal material or an electrically conductive material, etc., such as an ink. It needs to be stated that the color of the filler can be different from the color of the polymer, such that when observing imaging of a graphic structure, people can obviously distinguish a pattern in the graphic structure.

(32) The pattern may be a pattern or a micro pattern, or may be a plurality of same or different patterns or micro patterns (i.e. patterns in a micron level), such as a pattern for which it is easy to distinguish its shape, like a graph, a grid, a character, a number, a symbol, a landscape painting and/or a Logo, etc. The different (micro) patterns can be different in terms of size of (micro) patterns; or can be different in terms of shape of (micro) patterns; or can be different in terms of formation of (micro) patterns, for example a first (micro) pattern is a company name, the second (micro) pattern is a company Logo.

(33) The accommodation structure 202 (or the graphic structure 203) can be arranged matching with the microlens structure 201, specifically the accommodation structure 202 (or the graphic structure 203) can match with the location of the microlens structure 201. For example, a micro pattern in the accommodation structure 202 is arranged directly facing a microlens in the microlens structure 201, so as to improve utilization of a polymer material. The arrangement of matching the accommodation structure 202 (or the graphic structure 203) with the microlens structure 201 can also include an arrangement of one to one corresponding microlenses in the microlens structure 201 to micro grooves in the accommodation structure (or micro patterns in the graphic structure 203), which facilitates to ensure that each cut imaging film unit contains at least one complete microlens and micro groove (or micro pattern) when cutting an imaging film.

(34) The graphic structure 203 can be located near a focal plane of the microlens structure 201, can image via the microlens structure 201, and an enlarged image of the graphic structure 203 can be observed at the microlens structure 201's side opposite to the graphic structure 203. Specifically, each micro pattern in the graphic structure 203 can be located near a corresponding focal plane in the microlens structure 201, each micro pattern can image via a corresponding microlens, and an enlarged image of a corresponding micro pattern can be observed at another side of each microlens. The focal plane can be a plane which has represented a focus of a microlens and is perpendicular to a principal optic axis of a microlens array.

Figure 12:
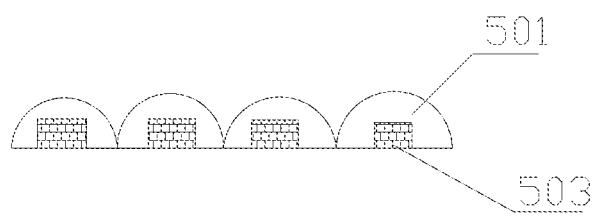
FIG. 12 is a structural schematic diagram of another polymer film, as provided by the embodiments of the present application.

(35) A distance between a top of the microlens structure 201 and a top of the accommodation structure 202 (or the graphic structure 203) can be 2~150 micrometers. When a distance between a microlens structure and a graphic structure is very small, it can be understood that the graphic structure is embedded in the microlens structure, as shown in FIG. 12. As can be seen from FIG. 12, the graphic structure 503 is embedded in the microlens structure 501. The smaller a distance between a microlens structure and a graphic structure is, the thinner a thickness of a polymer film is, which can not only save the cost, but also is easier to cut off when hot stamping.

(36) In another embodiment, a surface of a graphic structure can be provided with a protection structure. The protection structure is used for protecting a graphic structure, so as to prevent deformation of a (micro) pattern in the graphic structure or external damages to a (micro) pattern, affecting an image effect.

(37) As can be seen from the above description, a polymer film provided by the embodiments of the present application can be an one-layer film structure, a microlens structure and an accommodation structure are formed in the same polymer layer (i.e. formed as an integral structure), and there is no substrate layer, which realizes the purpose of reducing a thickness of a polymer film. In addition, the polymer film has no substrate layer, thus its mechanical property is very poor, such that the polymer film can be cut off easily when hot stamping.

(38) The thickness of the polymer film in the embodiments of the present application is thin, its thickness can reach less than dozens of micrometers, even several micrometers, and it is cut off easily. Therefore, this polymer film is easily transferred, and can reduce a weight and save the cost.

Figure 13:
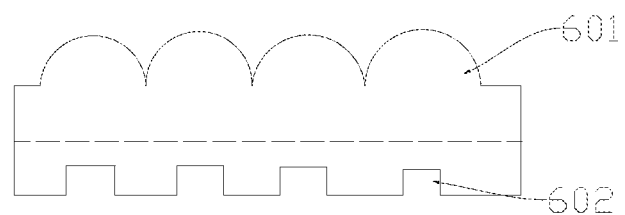
FIG. 13 is a structural schematic diagram of another polymer film which does not form a graphic structure, as provided by the embodiments of the present application.
Figure 14:
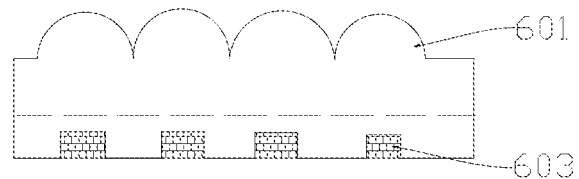
FIG. 14 is a structural schematic diagram of another polymer film which forms a graphic structure, as provided by the embodiments of the present application.

(39) The embodiments of the present application also provide another polymer film 60, as shown in FIG. 13. The polymer film 60 may comprise a first polymer having a first surface and a second polymer having a second surface, the first surface and the second surface being opposite to each other; the first surface is provided with a microlens structure 601; and the second surface is provided with an accommodation structure 602 which is used for forming a graphic structure 603 which images through the microlens structure 601, as shown in FIG. 14.

(40) The first polymer and the second polymer each can be a single polymer, or can be a mixed polymer formed by a plurality of single polymers which will not react. The transmittance of the first polymer and the second polymer each can be greater than 70%, namely the first polymer and the second polymer have a transparent color or are visually displayed transparent. The first polymer and the second polymer each may be a resin material, including a thermosetting resin and/or photocurable resin, such as an UV gel. A difference of refractive indexes between the first polymer and the second polymer can be less than 0.5, so as to ensure that the effect of an image in an imaging film observed by people is not influenced.

(41) An adjacent part between the first polymer and the second polymer is formed with a fusion portion. The adjacent part can be a contact part between the first polymer and the second polymer when using a mold to extrude the first polymer and the second polymer to form a microlens preliminary structure and an accommodation preliminary structure. The fusion portion can be a region formed by fusing the first polymer and the second polymer at a predetermined proportion. The predetermined proportion can be N:M, wherein N and M respectively are a content of a first polymer and a second polymer at a juncture of adjacent parts of the microlens structure 601 and the accommodation structure 602, its value can be 0~100%, but does not include 0 and 100%. It needs to be stated that a content of a first polymer in the microlens structure 601 is 100%; a content of a second polymer in the accommodation structure 602 is 100%. Therefore, the microlens structure 601 and the accommodation structure 202 can be deemed as an integral structure, there is no interface between a microlens structure and an accommodation structure, or there is no obvious boundary between a layer and a layer on a section of a polymer film, or a presented boundary is a regular and tidy boundary.

(42) A polymer film 60 provided by the embodiments of the present application differs from the polymer film 20 as shown in FIG. 1 in that the polymer film 60 is composed of two polymers, while the polymer film 20 is composed of one polymer. For the description of the polymer film 60, please refer to the description of the polymer film 20 in the above embodiments, detailed description thereof is omitted.

(43) As can be seen from the above descriptions, although a polymer film provided by the embodiments of the present application includes two polymers, it can be deemed as an one-layer film structure. Although a microlens structure and an accommodation structure are respectively formed on a first surface of a first polymer and a second surface of a second polymer, a fusion portion is formed between these two polymers, thus a microlens structure and an accommodation structure can be deemed as an integral structure. And a polymer film provided by the embodiments of the present application does not have a substrate layer either, thus can also realize the purpose of reducing the thickness of the polymer film. In addition, the mechanical property of the polymer film is very poor since there is no substrate layer, such that the polymer film can be cut off easily when hot stamping.

(44) The thickness of the polymer film in the embodiments of the present application is thin, its thickness can reach less than dozens of micrometers, even several micrometers, and it is cut off easily. Therefore, this polymer film is easily transferred, and can reduce a weight and save the cost.

Figure 15:
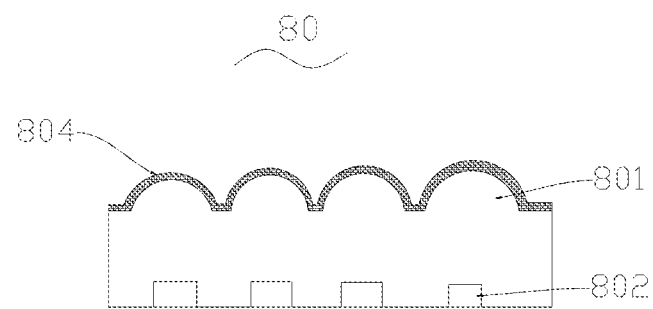
FIG. 15 is a structural schematic diagram of another polymer film (provided with a reflection structure) which does not form a graphic structure, as provided by the embodiments of the present application.
Figure 16:
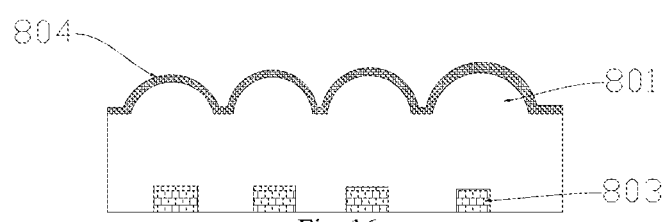
FIG. 16 is a structural schematic diagram of another polymer film (provided with a reflection structure) which forms a graphic structure, as provided by the embodiments of the present application.

(45) As shown in FIG. 15, the embodiments of the present application further provide another polymer film 80 which may comprise a polymer having a first surface and a second surface opposite to each other. A microlens structure 801 is formed on the first surface; a reflection structure 804 is provided on a surface of the microlens structure 801; an accommodation structure 802 is formed on the second surface, the accommodation structure 802 is used for forming a graphic structure 803 which images through the microlens structure 801, as shown in FIG. 16.

(46) The polymer can be a single polymer, or can be a mixed polymer formed by mixing a plurality of single polymers which will not react. The transmittance of the polymer can be greater than 70%, namely the polymer has a transparent color or is visually displayed transparent. The polymer may be a thermosetting resin and/or photocurable resin, such as an UV gel. The microlens structure 801 and the accommodation structure 802 can be respectively positioned on a first surface and a second surface opposite to each other in an one-layer polymer layer which is composed of such polymer, and at this moment, the polymers in the polymer layer can distribute evenly, or can distribute unevenly. Since the microlens structure 801 and the accommodation structure 802 are formed in the same polymer layer, there is no interface between the microlens structure 801 and the accommodation structure 802, namely the microlens structure 801 and the accommodation structure 802 are formed as an integral structure.

(47) The microlens structure 801 may contain a microlens array which may contain one or more microlenses. There is no gap among the plurality of microlenses, so as to reduce the overall volume of the polymer film; there can be a gap among the plurality of microlenses, such that the integrity of a cut microlens can be ensured when cutting the polymer film, thereby the subsequent imaging effect of the microlens can be ensured.

The accommodation structure 802 may contain one or more grooves, or may contain one or more micro grooves (i.e. grooves in a micron level). The (micro) grooves are used for being filled with a filler, so as to form a graphic structure 803.

(48) The graphic structure 803 contains a pattern formed after a filler is filled. The filler may be a material for which there is a refractive index difference between the polymer and the light, including a coloring material, a dyeing material, a metal material or an electrically conductive material, etc., such as an ink. It needs to be stated that the color of the filler can be different from the color of the polymer, such that when observing imaging of a graphic structure, people can obviously distinguish a pattern in the graphic structure.

(49) The pattern may be a pattern or a micro pattern, or may be a plurality of same or different patterns or micro patterns (i.e. patterns in a micron level), such as a pattern for which it is easy to distinguish its shape, like a graph, a grid, a character, a number, a symbol, a landscape painting and/or a Logo, etc. The different (micro) patterns can be different in terms of size of (micro) patterns; or can be different in terms of shape of (micro) patterns; or can be different in terms of formation of (micro) patterns, for example a first (micro) pattern is a company name, the second (micro) pattern is a company Logo.

(50) The accommodation structure 802 (or the graphic structure 803) can be arranged matching with the microlens structure 801, specifically the accommodation structure 802 (or the graphic structure 803) can match with the location of the microlens structure 801. For example, a micro pattern in the accommodation structure 803 is arranged directly facing a microlens in the microlens structure 801, so as to improve utilization of a polymer material. The arrangement of matching the accommodation structure 802 (or the graphic structure 803) with the microlens structure 801 can also include an arrangement of one to one corresponding microlenses in the microlens structure 801 to micro grooves in the accommodation structure (or micro patterns in the graphic structure 803), which facilitates to ensure that each cut imaging film unit contains at least one complete microlens and micro groove (or micro pattern) when cutting an imaging film.

(51) The graphic structure 803 can be located near a focal plane of the microlens structure 801, can image via the microlens structure 801, and under an action of the reflection structure 804, an enlarged image of the graphic structure 803 can be observed at a side where the graphic structure 803 is located. Specifically, each micro pattern in the graphic structure 803 can be located near a corresponding focal plane in the microlens structure 801, each micro pattern can image via a corresponding microlens, and an enlarged image of a corresponding micro pattern can be observed at a side where the graphic structure 803 is located.

(52) A distance between a top of the microlens structure 801 and a top of the accommodation structure 802 (or the graphic structure 803) can be 2~150 micrometers. When a distance between a microlens structure and a graphic structure is very small, it can be understood that the graphic structure is embedded in the microlens structure. The smaller a distance between a microlens structure and a graphic structure is, the thinner a thickness of a polymer film is, which can not only save the cost, but also is easier to cut off when hot stamping.

The reflection structure 804 can be a transparent material, an opaque material or a semi-transparent material. The thickness of the reflection structure 804 can be 0.02~5 micrometers.

(53) As can be seen from the above description, a polymer film provided by the embodiments of the present application can be an one-layer film structure, a microlens structure and an accommodation structure are formed in the same polymer layer (i.e. formed as an integral structure), and there is no substrate layer, which realizes the purpose of reducing a thickness of a polymer film. In addition, the polymer film has no substrate layer, thus its mechanical property is very poor, such that the polymer film can be cut off easily when hot stamping. In addition, a surface of a microlens structure is provided with a reflection structure, such that in an practical application, a side where a graphic structure is located can be fit with an practical application product, and imaging of the graphic structure is observed at a side where the graphic structure is located, which can avoid the problem of affecting a user experience effect caused by irregularities of a side where a microlens structure is located, when imaging of the graphic structure is observed at a side where a microlens structure is located, thus facilitating to improve a user's experience feelings.

The thickness of the polymer film in the embodiments of the present application is thin, its thickness can reach less than dozens of micrometers, even several micrometers, and it is cut off easily. Therefore, this polymer film is easily transferred.

Figure 17:
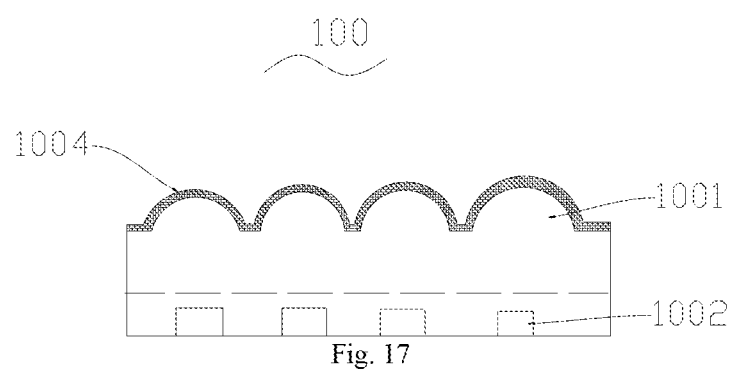
FIG. 17 is a structural schematic diagram of another polymer film (provided with a reflection structure) which does not form a graphic structure, as provided by the embodiments of the present application.
Figure 18:
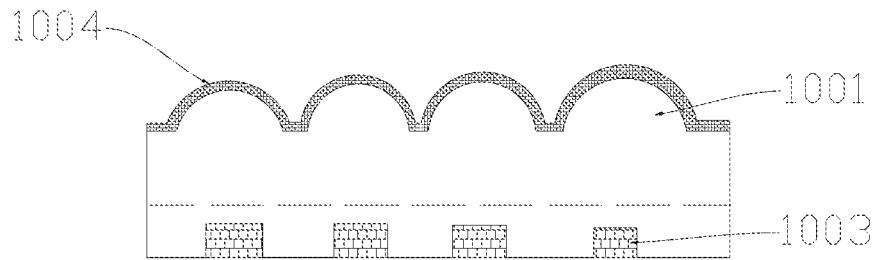
FIG. 18 is a structural schematic diagram of another polymer film (provided with a reflection structure) which forms a graphic structure, as provided by the embodiments of the present application.

(54) The embodiments of the present application also provide another polymer film 100, as shown in FIG. 17. The polymer film 100 may comprise a first polymer having a first surface and a second polymer having a second surface, the first surface and the second surface being opposite to each other; a microlens structure 1001 is formed on the first surface; a reflection structure 1004 is provided on a surface of an accommodation structure opposite to the microlens structure 1001; and the second surface is provided with an accommodation structure 1002 which is used for forming a graphic structure 1003 which images through the microlens structure 1001, as shown in FIG. 18.

(55) The first polymer and the second polymer each can be a single polymer, or can be a mixed polymer formed by a plurality of single polymers which will not react. The transmittance of the first polymer and the second polymer each can be greater than 70%, namely the first polymer and the second polymer have a transparent color or are visually displayed transparent. The first polymer and the second polymer each may be a resin material, including a thermosetting resin and/or photocurable resin, such as an UV gel. A difference of refractive indexes between the first polymer and the second polymer can be less than 0.5, so as to ensure that the effect of an image in an imaging film observed by people is not influenced.

(56) An adjacent part between the first polymer and the second polymer is formed with a fusion portion. The adjacent part can be a contact part between the first polymer and the second polymer when using a mold to extrude the first polymer and the second polymer to form a microlens preliminary structure and an accommodation preliminary structure. The fusion portion can be a region formed by fusing the first polymer and the second polymer at a predetermined proportion. The predetermined proportion can be N:M, wherein N and M respectively are a content of a first polymer and a second polymer at a juncture of adjacent parts of the microlens structure 601 and the accommodation structure 602, its value can be 0~100%, but does not include 0 and 100%. It needs to be stated that a content of a first polymer in the microlens structure 1001 is 100%; a content of a second polymer in the accommodation structure 1002 is 100%. Therefore, the microlens structure 1001 and the accommodation structure 1002 can be deemed as an integral structure, there is no interface between a microlens structure and an accommodation structure, or there is no obvious boundary between a layer and a layer on a section of a polymer film, or a presented boundary is a regular and tidy boundary.

(57) A polymer film 100 provided by the embodiments of the present application differs from the polymer film 80 as shown in FIG. 15 in that the polymer film 100 is composed of two polymers, while the polymer film 80 is composed of one polymer. For the detailed description of the polymer film 100, please refer to the description of the polymer film 80 in the above embodiments, detailed description thereof is omitted.

(58) As can be seen from the above descriptions, although a polymer film provided by the embodiments of the present application includes two polymers, it can be deemed as an one-layer film structure. Although a microlens structure and an accommodation structure are respectively formed on a first surface of a first polymer and a second surface of a second polymer, a fusion portion is formed between these two polymers, thus a microlens structure and an accommodation structure can be deemed as an integral structure. And a polymer film provided by the embodiments of the present application does not have a substrate layer either, thus can also realize the purpose of reducing the thickness of the polymer film. In addition, the mechanical property of the polymer film is very poor since there is no substrate layer, such that the polymer film can be cut off easily when hot stamping. In addition, a surface of a microlens structure is provided with a reflection structure, such that in an practical application, a side where a graphic structure is located can be fit with an practical application product, and imaging of the graphic structure is observed at a side where the graphic structure is located, which can avoid the problem of affecting a user experience effect caused by irregularities of a side where a microlens structure is located, when imaging of the graphic structure is observed at a side where a microlens structure is located, thus facilitating to improve a user's experience feelings.

(59) The thickness of the polymer film in the embodiments of the present application is thin, its thickness can reach less than dozens of micrometers, even several micrometers, and it is cut off easily. Therefore, this polymer film is easily transferred.

Figure 19:
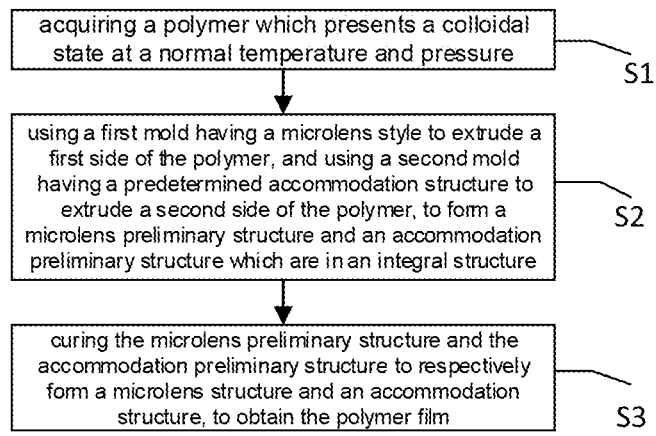
FIG. 19 is a flowchart of a manufacturing method of a polymer film, as provided by the embodiments of the present application.

The embodiments of the present application also provide a method for preparing a polymer film 60, as shown in FIG. 19. The method includes:

S1: acquiring a polymer which presents a colloidal state at a normal temperature and pressure.

The polymer can be a polymer, or can be two polymers. Each polymer can be a single polymer, such as a curable resin or UV gel, etc., or can be a mixed polymer of a plurality of polymers which will not react with each other.

The polymer can be acquired by using a method in a prior art, detailed description thereof will be omitted.

S2: using a first mold having a microlens style to extrude a first side of the polymer, and using a second mold having a predetermined accommodation structure to extrude a second side of the polymer, to form a microlens preliminary structure and an accommodation preliminary structure which are in an integral structure; wherein the first side and the second side are opposite to each other.

(60) After acquiring the polymer, using a first mold having a microlens style to extrude a first side of the polymer to form a microlens preliminary structure, and using a second mold having a predetermined accommodation structure to extrude a second side of the polymer to form an accommodation preliminary structure. The microlens preliminary structure and the accommodation preliminary structure form an integral structure during extruding. The microlens structure can be a microlens array having one or more microlenses. The accommodation preliminary structure can contain one or more micro grooves.

(61) Using a first mold having a microlens style to extrude a first side of the polymer to form a microlens preliminary structure and using a second mold having a predetermined accommodation structure to extrude a second side of the polymer to form an accommodation preliminary structure can be simultaneously using a first mold having a microlens style and a second mold having a predetermined accommodation structure to extrude a first side and a second side of the polymer to form a microlens preliminary structure and an accommodation preliminary structure; or can be first using a first mold having a microlens style to extrude a first side of the polymer to form a microlens preliminary structure, then within a first predetermined time interval, using a second mold having a predetermined accommodation structure to extrude a second side of the polymer to form an accommodation preliminary structure; can also be first using a second mold having a predetermined accommodation structure to extrude a second side of the polymer to form an accommodation preliminary structure, then within a first predetermined time interval, using a first mold having a microlens style to extrude a first side of the polymer to form a microlens preliminary structure. The first predetermined time interval can be set based on actual operation situations.

(62) When the polymer is a polymer, the first mold and the second mold can be used to simultaneously extrude a first side and a second side of the polymer, or to extrude a first side and a second side of the polymer within a first predetermined time interval, to form a microlens preliminary structure and an accommodation preliminary structure; when the polymer is two polymers, such as a first polymer and a second polymer, the first mold can be used to extrude a first side of the first polymer, meanwhile or within first predetermined time interval, the second mold can be used to extrude a second side of the second polymer, and during extruding, adjacent parts of the first polymer and the second polymer contact to form a fusion portion, and the microlens preliminary structure and the accommodation preliminary structure are formed.

S3. curing the microlens preliminary structure and the accommodation preliminary structure, to respectively form a microlens structure and an accommodation structure, so as to obtain the polymer film.

(63) After forming the microlens preliminary structure and the accommodation preliminary structure, the microlens preliminary structure and the accommodation preliminary structure can be cured, to respectively form a microlens structure and an accommodation structure. Curing the microlens preliminary structure and the accommodation preliminary structure can including simultaneously curing the microlens preliminary structure and the accommodation preliminary structure; or first curing the microlens preliminary structure, then curing the accommodation preliminary structure when the microlens preliminary structure is cured incompletely; or first curing the accommodation preliminary structure, then curing the microlens preliminary structure when the accommodation preliminary structure is cured incompletely.

(64) Curing the microlens preliminary structure and the accommodation preliminary structure can be directly thermocuring or photocuring the microlens preliminary structure and the accommodation preliminary structure; or by using an irradiation source or a heat source on the first mold and/or the second mold to realize curing of the microlens preliminary structure and the accommodation preliminary structure. For example, when the polymer is a UV gel, by using UV-irradiation, the microlens preliminary structure and the accommodation preliminary structure are cured to form a microlens structure and an accommodation structure.

(65) In each of the above embodiments, an adhesive force of the first mold and the polymer is greater than an adhesive force of the second mold and the polymer, such that when separating the second mold, the polymer is not separated from the first mold, thereby avoiding subsequent influence on a filling material in a groove structure.

(66) As can be seen from the above steps, in a method for preparing a polymer film provided by the embodiments of the present application, a microlens structure and an accommodation structure can be formed in one lump and cured simultaneously, there is no need to prepare a substrate layer, thereby the thickness of the polymer film can be reduced. In addition, this method is simple in terms of process, save materials, reduce the cost and is suitable for industrial production.

In another embodiment, in order that the polymer film can be used for imaging, the method can also include:

S4: filling a filler in an accommodation structure and forming a graphic structure, the filler and the polymer having different refractive indexes.

After obtaining the polymer film, a filler can be filled in the accommodation structure, curing measures such as drying or sintering, etc. can be taken for the filler, to form a graphic structure. The filler can have a refractive index different from the polymer, its color can also be different from the polymer, to facilitate observations.

In another embodiment, in order that pattern imaging can be observed at a side of a graphic structure to improve a user's experience effect, the preparation method can also include:

S5: providing a reflection structure on a surface of the microlens structure.

After forming the microlens structure, a reflection structure can be provided on a surface of the microlens structure, by adopting a method such as spraying, ink-jet printing, suspending printing, evaporation, magnetron sputtering or electroplating, etc.

In another embodiment, in order that the prepared film is used easily, the preparation method can also include:

S6: cutting the polymer film into film units having a predetermined size.

The film unit can at least contain a complete microlens and a groove or a pattern.

It needs to be stated that there is no limitation on a sequence for perform this step and the step S4.

The following is a further description on the above step by combining with an actual preparation method.

(67) In a specific process of preparing a film, a press fit device can be used to extrude the polymer's two sides opposite to each other. The press fit device may comprises a first roller and a second roller which are parallel and have a predetermined spacing distance; the first mold is provided on an outer peripheral face of the first roller, and the second mold is provided on an outer peripheral face of the second roller. The first roller and the second roller can be relatively placed vertically, or can be relatively placed horizontally. The first roller and the second roller can be placed facing to each other, or can be placed facing diagonally to each other. The first mold and the second mold can be respectively sleeved on the first roller and the second roller, or can be respectively engraved on the first roller and the second roller.

(68) When the first roller and the second roller can be relatively placed vertically, the polymer is injected between these two rollers, under actions of gravity and friction between the rollers, the polymer vertically passes through these two rollers to form the microlens preliminary structure and the accommodation preliminary structure. Then, during or after forming the microlens preliminary structure and the accommodation preliminary structure, these two rollers can be heated simultaneously, or one of the rollers is heated, to form a microlens structure and an accommodation structure by curing. It needs to be stated that a predetermined spacing distance between these two rollers can be adjusted based on a predetermined thickness between a microlens structure and an accommodation structure, to ensure that when the first surface and the second surface are located in different polymers, these two polymers form a fusion portion during the rollers roll and extrude, in such a way there is no interface between a microlens structure and a graphic structure which are formed by curing.

In addition, the press fit device can also contain a cutting tool, after obtaining a polymer film having a microlens structure and an accommodation structure, the polymer film is cut to facilitate subsequent use.

(69) When the first roller and the second roller can be relatively placed horizontally, a push force can be applied to cause the polymer to horizontally pass through these two rollers, to form a microlens preliminary structure and an accommodation preliminary structure, these two rollers are heated, the formed microlens preliminary structure and accommodation preliminary structure are cured simultaneously, to respectively form a microlens structure and an accommodation structure. For the detailed process for performing this mode, please refer to the detailed execution process for vertically placing a first roller and a second roller, detailed description thereof will be omitted.

Figure 20:
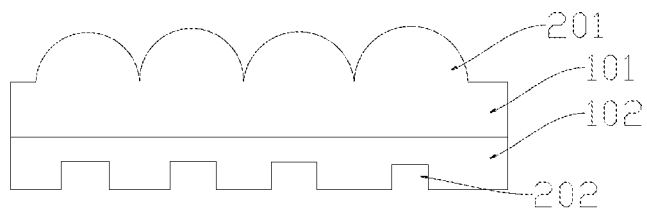
FIG. 20 is a structural schematic diagram of a polymer film which does not form a graphic structure, as provided by the embodiments of the present application.
Figure 21:
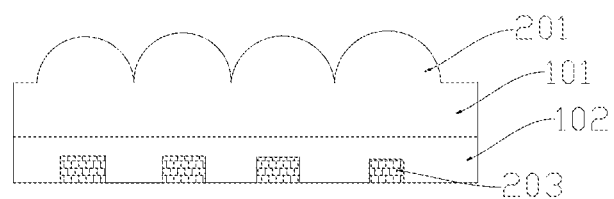
FIG. 21 is a structural schematic diagram of a polymer film which forms a graphic structure, as provided by the embodiments of the present application.

(70) As shown in FIG. 20, the embodiments of the present application provide a polymer film 20. The polymer film is composed of a first polymer layer 101 and a second polymer layer 102. A microlens structure 201 is formed on a first surface of the first polymer layer 101; an accommodation structure 202 is formed on a second surface of the second polymer layer 102. The accommodation structure 202 is used for forming a graphic structure 203 which images through the microlens structure 201, as shown in FIG. 21. The first surface and the second surface are arranged opposite to each other. Specifically, the first surface is a surface in the first polymer layer 101 far away from the second polymer layer 102, and the second surface is a surface in the second polymer layer 102 far away from the first polymer layer 101.

(71) The first polymer layer 101 can be formed by a first polymer; the second polymer layer 102 can be formed by a second polymer. The first polymer and the second polymer each can be a single polymer, or can be a mixed polymer formed by a plurality of single polymers which will not react. The first polymer and the second polymer can be different, for example the first polymer and the second polymer each may be different resin materials, including a thermosetting resin and/or photocurable resin, such as an UV gel. The first polymer of the first polymer layer 101 can distribute evenly, or can distribute unevenly; the second polymer of the second polymer layer 102 can distribute evenly, or can distribute unevenly. The transmittance of the first polymer and the second polymer each can be greater than 70%, namely the first polymer and the second polymer have a transparent color or are visually displayed transparent. A difference of refractive indexes between the first polymer and the second polymer can be less than 0.5, so as to ensure that the effect of an image in an imaging film observed by people is not influenced.

(72) Since the materials of forming the first polymer layer 101 and the second polymer layer 102 are different, thus when the first polymer layer 101 and the second polymer layer 102 are not cured and formed simultaneously, it is possible to form an interface between the first polymer layer 101 and the second polymer layer 102. The interface can be an interface formed by a surface in the first polymer layer opposite to the first surface contacting a surface in the second polymer layer opposite to the second surface.

(73) The first polymer layer 101 and the second polymer layer 102 being not cured and formed simultaneously can mean that first a microlens structure 101 is formed on the first surface of the first polymer layer 101; then the second polymer layer 102 is coated on a surface in the first polymer layer 101 opposite to the first surface, and an accommodation structure 102 is formed on the second surface of the second polymer layer 102. Specifically, a microlens preliminary structure can be formed on the first surface of the first polymer layer 101 by using a first mold having a microlens style, the microlens preliminary structure is cured to form a microlens structure 201; then the second polymer layer 102 is coated on a surface in the first polymer layer opposite to the first surface; then an accommodation preliminary structure is formed on the second surface of the second polymer layer 102 by using a second mold having a predetermined pattern style, the accommodation preliminary structure is cured to form an accommodation structure 202.

(74) The first polymer layer 101 and the second polymer layer 102 being not cured and formed simultaneously can mean that first an accommodation structure 102 is formed on the second surface of the second polymer layer 102; then the first polymer layer 101 is coated on a surface in the second polymer layer opposite to the second surface, and a microlens structure 101 is formed on the first surface of the first polymer layer 101. For the detailed process, please refer to the description in the previous paragraph, detailed description thereof will be omitted.

(75) The first polymer layer 101 and the second polymer layer 102 being not cured and formed simultaneously can also mean that after forming a microlens preliminary structure on the first surface of the first polymer layer 101, the microlens preliminary structure is cured, when the microlens preliminary structure is cured incompletely to form a microlens structure 201, then the second polymer layer 102 is coated on a surface in the first polymer layer opposite to the first surface, and an accommodation structure 102 is formed on the second surface of the second polymer layer 102.

(76) The first polymer layer 101 and the second polymer layer 102 being not cured and formed simultaneously can also mean that after forming an accommodation preliminary structure on the second surface of the second polymer layer 102, the accommodation preliminary structure is cured; when the accommodation preliminary structure is cured incompletely to form an accommodation structure 202, the first polymer layer 101 is coated on a surface in the second polymer layer 102 opposite to the second surface, and a microlens structure 201 is formed on the first surface of the first polymer layer 101.

Figure 22:
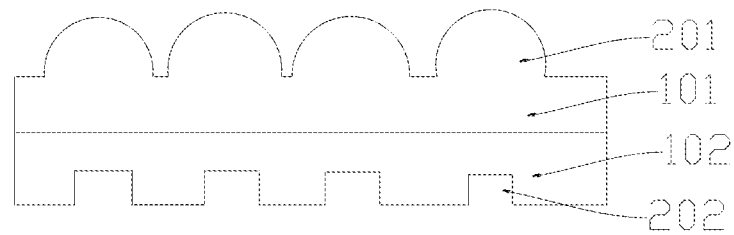
FIG. 22 is a structural schematic diagram of another polymer film, as provided by the embodiments of the present application.

(77) The microlens structure 201 may contain a microlens array which may contain one or more microlenses. There is no gap among the plurality of microlenses, so as to reduce the overall volume of the polymer film; there can be a gap among the plurality of microlenses (as shown in FIG. 22), such that the integrity of a cut microlens can be ensured when cutting the polymer film, thereby the subsequent imaging effect of the microlens can be ensured.

The accommodation structure 202 may contain one or more grooves, or may contain one or more micro grooves (i.e. grooves in a micron level). The (micro) grooves are used for being filled with a filler, so as to form a graphic structure 203.

(78) The graphic structure 203 contains a pattern formed after a filler is filled. The filler may be a material for which there is a refractive index difference between the first and second polymers and the light, including a coloring material, a dyeing material, a metal material or an electrically conductive material, etc., such as an ink. It needs to be stated that the color of the filler can be different from the color of the first and second polymers, such that when observing imaging of a graphic structure, people can obviously distinguish a pattern in the graphic structure.

(79) The pattern may be a pattern or a micro pattern, or may be a plurality of same or different patterns or micro patterns (i.e. patterns in a micron level), such as a pattern for which it is easy to distinguish its shape, like a graph, a grid, a character, a number, a symbol, a landscape painting and/or a Logo, etc. The different (micro) patterns can be different in terms of size of (micro) patterns; or can be different in terms of shape of (micro) patterns; or can be different in terms of formation of (micro) patterns, for example a first (micro) pattern is a company name, the second (micro) pattern is a company Logo.

(80) The accommodation structure 202 (or the graphic structure 203) can be arranged matching with the microlens structure 201, specifically the accommodation structure 202 (or the graphic structure 203) can match with the location of the microlens structure 201. For example, a micro pattern in the accommodation structure 203 is arranged directly facing a microlens in the microlens structure 201, so as to improve utilization of a polymer material. The arrangement of matching the accommodation structure 202 (or the graphic structure 203) with the microlens structure 201 can also include an arrangement of one to one corresponding microlenses in the microlens structure 201 to micro grooves in the accommodation structure 202 (or micro patterns in the graphic structure 203), which facilitates to ensure that each cut film unit contains at least one complete microlens and micro groove (or micro pattern) when cutting a polymer film.

(81) The graphic structure 203 can be located near a focal plane of the microlens structure 201, can image via the microlens structure 201, and an enlarged image of the graphic structure 203 can be observed at the microlens structure 201's side opposite to the graphic structure 203. Specifically, each micro pattern in the graphic structure 203 can be located near a corresponding focal plane in the microlens structure 201, each micro pattern can image via a corresponding microlens, and an enlarged image of a corresponding micro pattern can be observed at another side of each microlens. The focal plane can be a plane which has represented a focus of a microlens and is perpendicular to a principal optic axis of a microlens array.

(82) A distance between a top of the microlens structure 201 and a top of the accommodation structure 202 (or the graphic structure 203) can be 2~150 micrometers. The smaller a distance between a microlens structure and a graphic structure is, the thinner a thickness of a polymer film is, which can not only save the cost, but also is easier to cut off when hot stamping.

Figure 23:
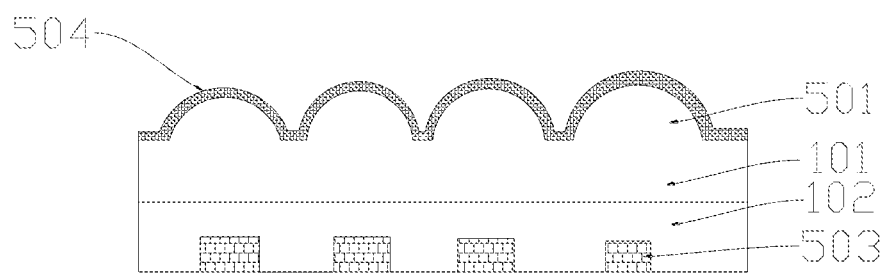
FIG. 23 is a structural schematic diagram of another polymer film (provided with a reflection structure), as provided by the embodiments of the present application.

(83) In an embodiment, a surface of a microlens structure is provided with a reflection structure, as shown in FIG. 23. The reflection structure 504 is located on the microlens structure 501's surface far away from the graphic structure 503. Under an action of the reflection structure 504, an enlarged image of the graphic structure 503 can be observed at a side where the graphic structure 503 is located. Specifically, each micro pattern in the graphic structure 503 can be located near a corresponding focal plane in the microlens structure 501, each micro pattern can image via a corresponding microlens, and an enlarged image of a corresponding micro pattern can be observed at a side where the graphic structure 503 is located, such that in an practical application, a side where a graphic structure is located can be fit with an practical application product, and imaging of the graphic structure is observed at a side where the graphic structure is located, which can avoid the problem of affecting a user experience effect caused by irregularities of a side where a microlens structure is located, when imaging of the graphic structure is observed at a side where a microlens structure is located, thus facilitating to improve a user's experience feelings.

In an embodiment, a surface of a graphic structure can be provided with a protection structure. The protection structure is used for protecting a graphic structure, so as to prevent deformation of a (micro) pattern in the graphic structure, affecting an image effect.

(84) As can be seen from the above description, a polymer film provided by the embodiments of the present application can be a two-layer film structure, a microlens structure and an accommodation structure are formed in different polymer layers, there is an interface between the two-layer polymer layers, however the polymer film has no substrate layer, which realizes the purpose of reducing the thickness of the polymer film. In addition, the polymer film has no substrate layer, thus its mechanical property is poor, such that the polymer film can be cut off easily when hot stamping.

The thickness of the polymer film in the embodiments of the present application is thin, its thickness can reach less than dozens of micrometers, even several micrometers, and it is cut off easily. Therefore, this polymer film is easily transferred.

(85) Any numerical value referred in the present application includes all the values of a lower value and an upper value increasing by one unit between a lower limiting value and an upper limiting value, there is an interval with at least two units between any lower value and any higher value. For example, if elaborating a value of a quantity or a process variable (such as temperature, pressure, time, etc.) of a component is from 1 to 90, preferably from 20 to 80, more preferably from 30 to 70, the purpose is to explain the Description also clearly lists the values such as 15 to 85, 22 to 68, 43 to 51 and 30 to 31, etc. For a value less than 1, it is appropriately considered that one unit is 0.0001, 0.001, 0.01, 0.1. These are only examples to be clearly expressed, it can be considered that all possible combinations of the listed values between the lowest value and the highest value are clearly elaborated in the present Description in similar ways.

Unless otherwise stated, all the ranges include endpoints and all the numbers among the endpoints. "About" or "approximate" used together with a range are suitable for two endpoints of the range. Thus, "about 20 to 30" aims to cover "about 20 to about 30", at least including specified endpoints.

(86) For various purposes, all the disclosed articles and reference materials, including patent applications and publications, are hereby incorporated by reference. The term "basically composed of . . . " for describing a combination should include a determined element, an ingredient, a component or a step and other elements, ingredient, components or steps which do not substantially affect a basic novelty feature of the combination. When using the term "contain" or "include" to describe a combination of an element, an ingredient, a component or a step here, it is also conceivable of an embodiment basically formed by such element, an ingredient, a component or a step. The term "may/can" is used to explain that any described property included by "may/can" is optional.

A plurality of elements, ingredient, components or steps can be provided by a single integrated element, an ingredient, a component or a step. Alternatively, a single integrated element, an ingredient, a component or a step can be divided into a plurality of separated elements, ingredient, components or steps. "A" or "one" for describing an element, an ingredient, a component or a step is not for excluding other elements, ingredient, components or steps.

It should be understood that the above description is for graphic illustration, not for limiting. By reading the above description, many embodiments and many applications besides the provided examples are obvious for persons skilled in the art. Therefore, the scope of the present teaching should not be determined according to the above description, but should be determined according to the attached claims and all the scopes of equivalents owned by these claims. For all purposes, the disclosures of all articles and references, including patent applications and announcements, are incorporated herein by reference. The omission of the subject matter in any aspect disclosed herein in the preceding claims is not intended to disclaim the subject matter, nor should it be considered that the inventor does not consider the subject matter as a portion of the disclosed subject matter of the invention.

The invention claimed is:

1. An optical film of a double-sided structure, comprising: a body which includes a first polymer and a second polymer, having a first surface and a second surface opposite to each other; and an accommodation mechanism provided on the first surface and the second surface; and a filler filled in the accommodation mechanism for forming a graphic structure; the upper surface of the filler is just flush with the first surface and the second surface respectively to form a plane structure; adjacent parts of the first polymer and the second polymer are fused with each other such that the body comprising the accommodation mechanism is an integral structure; an adjacent part between the first polymer and the second polymer is formed with a fusion portion, the fusion portion can be a region formed by fusing the first polymer and the second polymer at a predetermined proportion; a fusion location of the first polymer and the second polymer does not form an interface, and a difference value of refractive indexes of the first polymer and the second polymer is less than 0.5; the first polymer and the second polymer each comprises a thermosetting resin, a photocurable resin or a mixture of the thermosetting resin and the photocurable resin.

2. The optical film of a double-sided structure according to claim 1, wherein the accommodation mechanism comprises a groove.

3. The optical film of a double-sided structure according to claim 1, wherein the accommodation mechanism accommodates a filler to form the graphic structure.

4. The optical film of a double-sided structure according to claim 3, wherein the filler comprises one or more of an electrically conductive material, a coloring material, or a dyeing material.

5. The optical film of a double-sided structure according to claim 1, wherein the light transmittance of the body is above 0.7.

6. The optical film of a double-sided structure according to claim 1, wherein the accommodation mechanism accommodates an electrically conductive material to form a printed circuit film of a double-sided structure which can be used for touch screen.

7. The optical film of a double-sided structure according to claim 6, wherein the electrically conductive material comprises one or more of an electrically conductive metal, an electrically conductive carbon tube, a graphene, or an electrically conductive polymer.

8. The optical film of a double-sided structure according to claim 1, wherein there are only the filler, the first polymer and the second polymer between the first surface and the second surface.

* * * * *